(12) United States Patent
Peterka et al.

(10) Patent No.: US 8,214,630 B2
(45) Date of Patent: Jul. 3, 2012

(54) METHOD AND APPARATUS FOR CONTROLLING ENABLEMENT OF JTAG INTERFACE

(75) Inventors: Petr Peterka, San Diego, CA (US); Alexander Medvinsky, San Diego, CA (US)

(73) Assignee: General Instrument Corporation, Horsham, PA (US)

( * ) Notice: Subject to any disclaimer, the term of this patent is extended or adjusted under 35 U.S.C. 154(b) by 511 days.

(21) Appl. No.: 12/391,488

(22) Filed: Feb. 24, 2009

(65) Prior Publication Data

US 2010/0217964 A1 Aug. 26, 2010

(51) Int. Cl.
G06F 15/177 (2006.01)
G06F 21/00 (2006.01)
G06F 11/30 (2006.01)
H04L 9/32 (2006.01)

(52) U.S. Cl. ............... 713/1; 713/2; 713/100; 713/172; 713/185; 713/189

(58) Field of Classification Search .................. 713/1
See application file for complete search history.

(56) References Cited

U.S. PATENT DOCUMENTS

| 5,325,430 | A | * | 6/1994 | Smyth et al. | 713/192 |
| 5,892,906 | A | * | 4/1999 | Chou et al. | 726/19 |
| 6,094,702 | A | * | 7/2000 | Williams et al. | 711/101 |
| 6,708,272 | B1 | * | 3/2004 | McCown et al. | 713/151 |
| 7,080,789 | B2 | * | 7/2006 | Leaming | 235/492 |
| 7,117,352 | B1 | * | 10/2006 | Giles et al. | 713/2 |
| 7,237,121 | B2 | * | 6/2007 | Cammack et al. | 713/189 |
| 7,634,701 | B2 | * | 12/2009 | Morgan et al. | 714/726 |
| 7,810,002 | B2 | * | 10/2010 | Dunn et al. | 714/726 |
| 7,886,150 | B2 | * | 2/2011 | Stollon et al. | 713/171 |
| 7,936,875 | B2 | * | 5/2011 | Sozzani | 380/44 |
| 2006/0282734 | A1 | * | 12/2006 | Milne et al. | 714/742 |

* cited by examiner

*Primary Examiner* — Nitin Patel
(74) *Attorney, Agent, or Firm* — Susan R. Payne

(57) ABSTRACT

A method, device and system for controlling JTAG interface enablement within a communication device. The JTAG interface can be selectively enabled based on the receipt of an encrypted access token generated by an access token server. The access token server generates the access token in response to an end user providing appropriate device-specific information. The access token includes appropriate information that, upon appropriate authentication and decryption, can temporarily device bind the boot code image of the device in a manner that enables the JTAG interface. Alternatively, the access token includes appropriate information that instructs the general purpose processor to choose between JTAG interface enablement information and JTAG interface disablement information for use with the boot code image of the device. The access token can include expiration information that causes an enabled JTAG interface to revert back to its disabled status upon expiration of the access token.

18 Claims, 5 Drawing Sheets

METHOD AND APPARATUS FOR CONTROLLING ENABLEMENT OF JTAG INTERFACE

BACKGROUND OF THE INVENTION

1. Field of the Invention

The invention relates to devices that include a Joint Test Action Group (JTAG) interface. More particularly, the invention relates to methods and devices for controlling the enablement of JTAG interfaces on such devices.

2. Description of the Related Art

The Joint Test Action Group (JTAG) interface is an interface often included as part of many end user communication devices to allow access to device processors and other integrated circuit components within the device. For example, for developers of firmware and other code embedded within a particular end user communication device, the JTAG interface can be used to allow the use of a debugger on the processor embedded within the device. Therefore, enabling the JTAG interface to allow access to the debugger can improve the firmware development cycle.

However, once the end user communication device has been shipped to a customer, an enabled JTAG interface poses a security risk, especially for devices using a digital rights management (DRM) system for protecting content contained within or accessible by the device. Therefore, control of the JTAG interface should be such that the JTAG interface is enabled or turned on during development and production of the end user communication device but disabled or turned off once production is complete and the device is shipped to customers. But, it also may be desirable for the JTAG interface to be enabled after the end user communication device has been shipped to a customer. For example, if an end user reports problems with a device, the device may be taken to a repair facility and the JTAG interface may be unlocked to allow engineers to diagnose the problem.

Some conventional embedded processor platforms allow the JTAG interface to be enabled when the user provides a key or password unique to the end user communication device. A secure encrypted object can be used to securely deliver such a unique key or password. For example, access tokens that contain debugging rights for a specific device or list of devices can be used for this purpose.

Alternatively, other conventional platforms are based on a JTAG control block in the signed boot code. As the boot code is loaded during the device's secure boot process, the value of the JTAG control block determines whether or not the JTAG interface is enabled. However, the use of this JTAG control block mechanism does not bind the signed code to the particular device containing the JTAG interface. Therefore, access to the signed boot code containing the JTAG control block could allow a user to enable the JTAG interfaces of other end user communication devices.

Other conventional platforms are based on a flag in the boot code image determining whether or not the JTAG interface is enabled. The JTAG on/off flag is included in the boot module and is loaded during the device's boot process. The boot module can be both signed and encrypted to prevent tampering and disclosure.

Once the boot code image has been created, signed and encrypted with a JTAG=ON enablement flag, the boot code image would have to be kept secret. Because the enablement of the JTAG interface is intended for development and debugging, end user communication devices shipped to customers (production devices) must have a different version of the boot code than the boot code of development devices, i.e., a version of the boot code with a JTAG=OFF enablement flag.

However, it is undesirable to base device security on a single global value. In this particular case, a signed and encrypted boot code image with a JTAG=ON enablement flag constitutes the one global value that can compromise the security of all other devices that are based on this particular security system, and that share the same boot public key, which is used to verify the signature on the boot code image, and the same global encryption key (GEK), which is used to decrypt the boot code image.

One way to address this problem is to make sure that development devices and production devices have different boot public keys and/or different GEKs. In this manner, a boot code image with a JTAG=ON enablement flag that is signed and encrypted for development devices will not work on production devices. However, such approach does not allow for JTAG interface enablement on production devices. Therefore, if a production device shipped to a customer needs to be debugged, a developer would not be able to access the code for debugging because the JTAG interface can not be enabled.

Accordingly, there has been a need to provide a method and device for controlling JTAG interface enablement to a single device or specified group of devices that overcomes the disadvantages associated with conventional JTAG interface enablement mechanisms.

DETAILED DESCRIPTION

Figure 1:
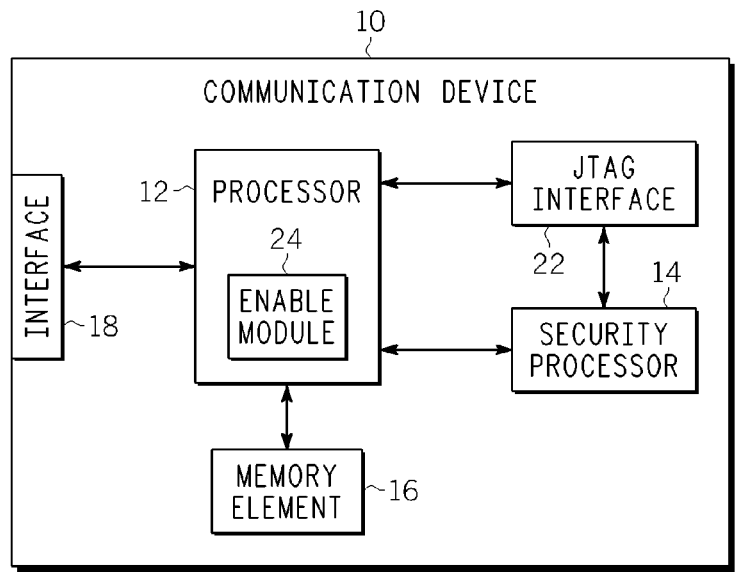
FIG. 1 is a block diagram of an end user communication device for controlling JTAG interface enablement.

In the following description, like reference numerals indicate like components to enhance the understanding of the JTAG enablement control methods and devices through the description of the drawings. Also, although specific features, configurations and arrangements are discussed herein below, it should be understood that such specificity is for illustrative purposes only. A person skilled in the relevant art will recognize that other steps, configurations and arrangements are useful without departing from the spirit and scope of the invention.

Referring now to FIG. 1, shown is a block diagram of a device 10 configured for controlling JTAG interface enablement. The device 10 can be any suitable end user communication device configured to receive, process, store, display and/or otherwise execute or consume content, including DRM-protected content and/or associated rights issuance information. Typically, the device 10 is configured with an appropriate digital rights management (DRM) system that allows the device 10 to protect the content within the device 10 from external attempts to obtain, alter or otherwise compromise the protected content.

For example, the end user communication device can be any signal converter or decoder (set-top) box, including set-top boxes with internal and/or external recording capabilities and local and/or remote storage, which often are referred to as personal video recorder (PVR) devices, digital video recorder (DVR) devices and/or digital video server (DVS) devices. Other suitable end user communication devices include residential gateways, home media server systems, digital media servers (DMS), digital video disk recorders, computers, televisions with built-in or added-on content receiving and storing capability, and/or other suitable computing devices or content devices, including internet protocol (IP), satellite and cable digital video recorders, and home area network (HAN) devices and systems. Also, the end user communication device can be a mobile communication device, such as a cellular telephone, a smart telephone (smartphone), a personal digital assistant (PDA), a digital music player (e.g., MP3 player), a portable video player, a portable media player (PMP) and/or other handheld mobile device, a media player in an automobile, a laptop personal computer (PC), notebook PC and/or other mobile computing device.

The device 10 includes a general purpose (host) controller or processor 12 that, in general, processes multimedia content and other information received by the device 10. The processor 12 generally processes instructions, access requests and other control information received by the communication device 10. The processor 12 also provides appropriate authorization for access to protected content. The processor 12 also manages the movement of various instructions and control information to and from other components within the communication device 10. In addition to the general purpose processor 12, the device 10 also can include a security processor 14 coupled to the general purpose processor 12. The security processor 14 is configured to perform some security functions, such as unlocking the JTAG interface, verifying signature of the boot code, and decrypting content. In some device implementations, the security processor 14 may be part of the general purpose processor 12.

The device 10 also can include a memory or content storage element 16, coupled to the processor 12, for storing content received by the device 10 and other information, as needed. In addition to the memory element 16, the device 10 can include at least one type of memory or memory unit (not shown) within the processor 12 and/or a storage unit or data storage unit coupled to the processor 12 for storing processing instructions and/or information received and/or created by the device 10.

The device 10 also can include one or more interfaces 18 for receiving content and other information, e.g., from a content source that is part of a content provider network, or from another device. It should be understood that the interface 18 can be a single input/output interface, or the device 10 can include separate input and output interfaces. Also, it should be understood that the interface 18 can be an interface configured to support more than one connection from more than one network device. The device 10 also includes a JTAG interface 22 coupled to the processor 12. As discussed hereinabove, many end user communication devices include a JTAG interface for allowing access to device processors and other components within the device, e.g., for firmware development and debugging purposes.

Upon startup, the device 10 typically executes a boot process or sequence. The boot process typically is stored in the read only memory (ROM) portion or other suitable portion of memory within the device 10. The boot process loads a boot code or boot code image into the system memory of the device 10. A portion of the boot code image may be allocated for storing authentication information, e.g., a password to protect unauthorized users from booting the system or accessing setup options, and/or authentication information to permit the installation and/or operation of software. The authentication information typically is encrypted. It should be understood that the authentication information may be encrypted using one or more suitable encryption schemes.

As will be discussed in greater detail hereinbelow, the device 10 also includes an enablement or JTAG enablement module 24. The JTAG enablement module 24 includes the software and/or hardware necessary to enable or disable the JTAG interface, i.e., to allow or prevent access to processors and/or other components within the device 10, e.g., for development and/or debugging. The JTAG enablement module 24 can enable or disable the JTAG interface based on suitable information and/or instructions existing in and/or received by the device 10, e.g., information included within the boot code image. Although the JTAG enablement module 24 is shown within or as part of the general purpose processor 12, it should be understood that the JTAG enablement module 24 can be coupled to the general purpose processor 12 and/or the security processor 14, or included within the security processor 14.

One or more of the processor 12, the security processor 14, the memory element 16, the interface 18, the JTAG interface 22 and the JTAG enablement module 24 can be comprised partially or completely of any suitable structure or arrangement, e.g., one or more integrated circuits. Also, it should be understood that the communication device 10 includes other components, hardware and software (not shown) that are used for the operation of other features and functions of the communication device 10 not specifically described herein.

The communication device 10 can be partially or completely configured in the form of hardware circuitry and/or other hardware components within a larger device or group of components. Alternatively, the communication device 10 can be partially or completely configured in the form of software, e.g., as processing instructions and/or one or more sets of logic or computer code. In such configuration, the logic or processing instructions typically are stored in a data storage device, e.g., the memory element 16 or other suitable data storage device (not shown). The data storage device typically is coupled to a processor or controller, e.g., the processor 12. The processor accesses the necessary instructions from the data storage element and executes the instructions or transfers the instructions to the appropriate location within the communication device 10.

According to the JTAG interface enablement control methods described herein, the JTAG interface 22 in the communication device 10 can be selectively enabled based on the receipt of an encrypted access token built or generated by an access token server and delivered to the communication device 10. The access token server builds or generates the access token in response to an end user providing the access token server with appropriate device-specific information about the device 10, which effectively authorizes the end user to enable the JTAG interface 22 in the device 10. The access token includes appropriate information that, upon appropriate authentication and decryption, can temporarily device bind the boot code image of the device 10 in a manner that enables the JTAG interface 22. Alternatively, the access token includes appropriate information that, upon appropriate authentication and decryption, instructs the general purpose processor 12 to choose between JTAG interface enable information and JTAG interface disable information for use with the boot code image of the device 10. The access token can include expiration information that causes an enabled JTAG interface to revert back to its disabled status upon expiration of the access token.

As discussed hereinabove, many conventional device processor platforms determine whether or not the JTAG interface is enabled based on a flag or other information in the boot code image. The boot code can be signed by a digital signature, which uses an authentication method based on encryption to "sign" electronic payloads. Also, optionally, the boot code may be encrypted so as to hide any secret values contained in the boot code and to make reverse engineering more difficult.

Also, in these platforms, the processor, e.g., the security processor, is configured to allow the processor boot code already stored in the device to be decrypted with the GEK and re-encrypted with a unit specific key (USK), which is a unique per-chip key that is randomly generated in the factory and is not known anywhere outside of the chip that includes the boot code. Once the boot code has been re-encrypted with the USK, the boot code is bound to the processor chip and is not useful in another device.

According to JTAG interface enablement controlling methods described herein, the enablement module and/or other appropriate components of a specific end user communication device can be configured to allow the device's JTAG interface to be enabled (JTAG=ON). However, the GEK-encrypted boot code image that contains the JTAG interface enabling information must not be made available in any persistent memory, including persistent memory in the communication device and in the content distribution system (i.e., public network interfaces) in which the communication device is included.

Figure 2:
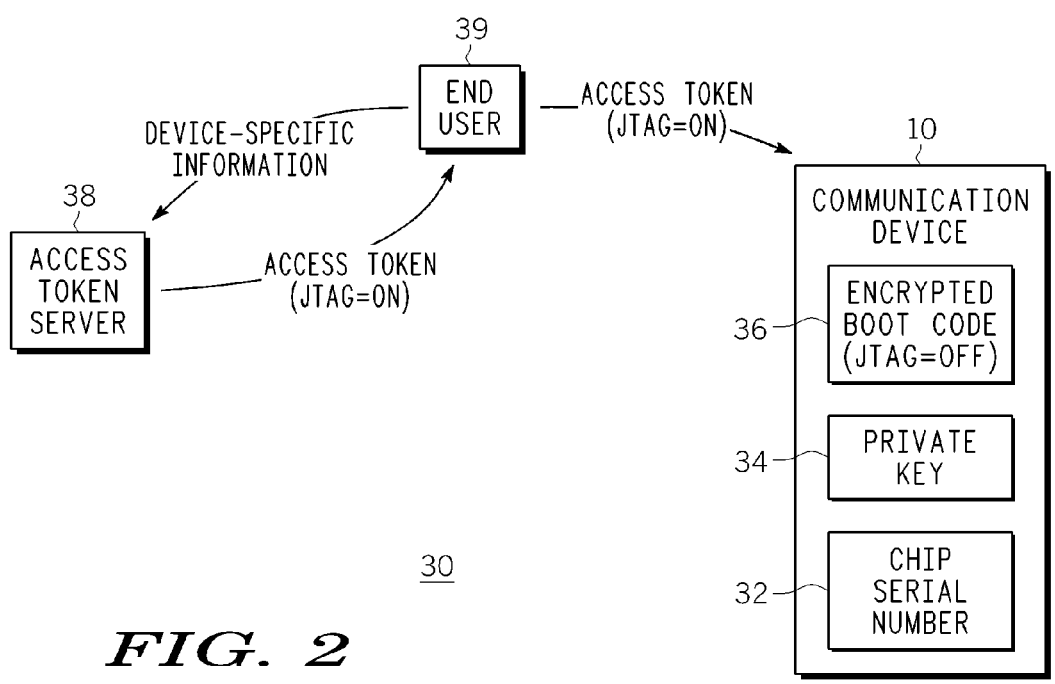
FIG. 2 is a block diagram of a system for controlling JTAG interface enablement of an end user communication device.

Referring now to FIG. 2, shown is a block diagram of a system 30 for controlling JTAG interface enablement in an end user communication device. The system 30 includes an end user communication device, such as the communication device 10 shown in FIG. 1. The communication device 10 includes a chip serial number 32, which is a unique serial number from one or more particular chips, e.g., processor chips, within the communication device 10. Also, before shipment, the communication device 10 is assumed to be preloaded with a private key 34 unique to the communication device 10. A public key or a digital certificate corresponding to this private key may be stored in the same device or it may be available from a separate repository of public keys and/or digital certificates. Also, before shipment of the communication device 10, the boot code (e.g., security processor boot code) of the communication device 10 is assumed to be configured in a manner that disables the JTAG interface (JTAG=OFF) and the boot code is encrypted using a global encryption key (GEK). The encrypted boot code is shown generally as encrypted boot code 36.

The system 30 also includes an access token server 38, which is configured to receive from an end user (shown as 39), e.g., via an end user terminal (not shown), a request to enable the JTAG interface in the communication device 10. The access token server 38 also is configured to receive from the end user 39 appropriate device-specific information or parameters to initiate the process of the access token server 38 generating an access token that includes appropriate information to be used by the communication device 10 to enable its JTAG interface, as will be described in greater detail below.

The access token server 38 can be part of or located within any suitable portion of a content distribution system that includes the communication device 10. For example, the access token server 38 can be a web server with a suitable browser interface. To log on to the access token server 38, an end user typically has to provide their name and password. Typically, the password is a secure identification (ID) code.

Figure 3:
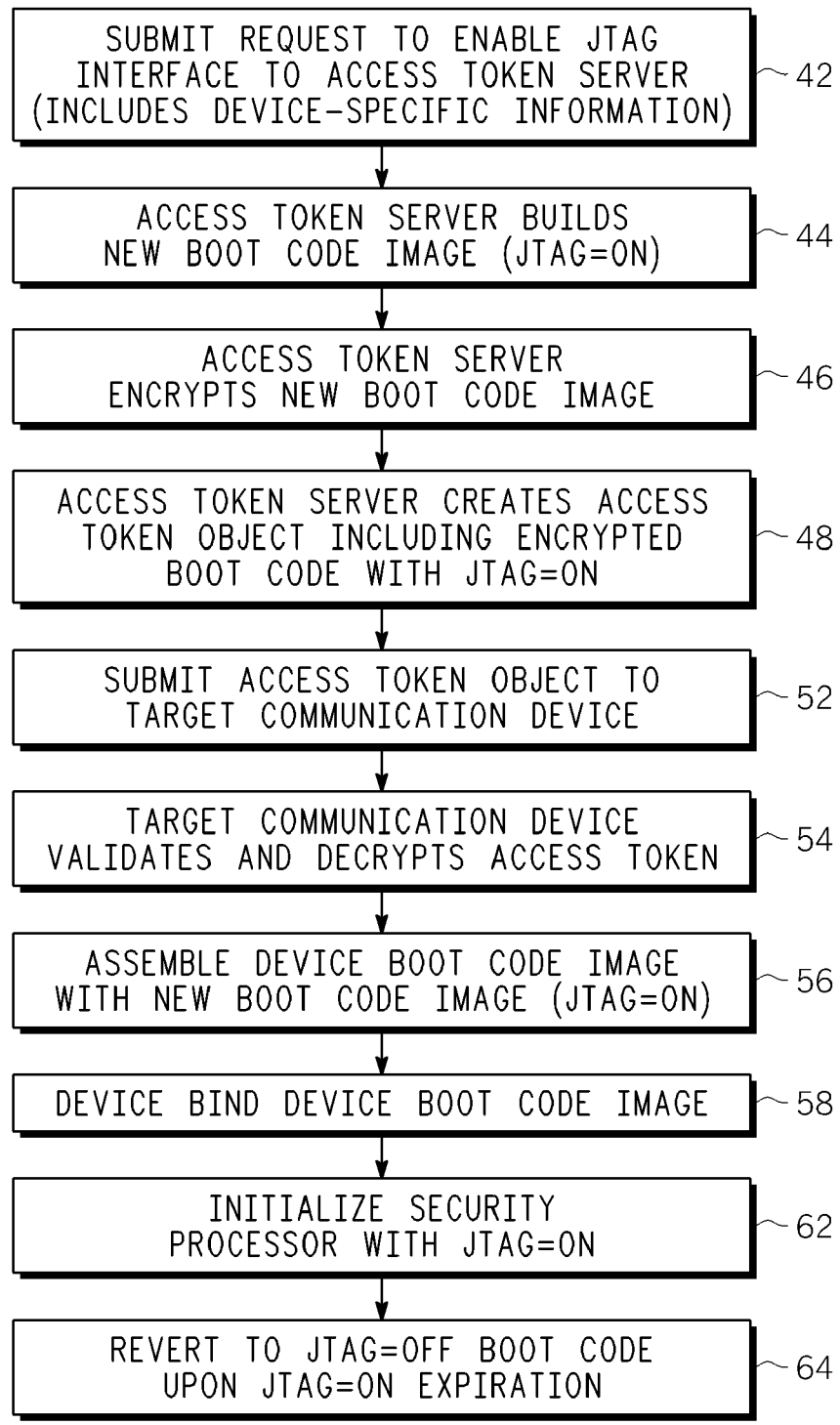
FIG. 3 is a flow chart that schematically illustrates a method for controlling JTAG interface enablement of the communication device in the system shown in FIG. 2.

Referring now to FIG. 3, with continuing reference to FIG. 2, shown is a flow chart that schematically illustrates a method 40 for controlling JTAG interface enablement of the communication device 10 within the system 30 shown in FIG. 2. The method 40 will be discussed with reference to the system 30 shown in FIG. 2.

The method 40 includes a step 42 of submitting a request to enable or unlock the JTAG interface of a communication device having a specific (processor) chip, e.g., the communication device 10. When a need arises to enable the JTAG interface of the communication device 10, e.g., for processor debugging after the communication device 10 has been shipped to a customer, the end user 39 logs on to the access token server 38 and, upon recognition by the access token server as an authorized end user, submits a request to enable the JTAG interface of the communication device 10.

As part of the request to enable the JTAG interface of the communication device 10, the end user 39 enters or submits to the access token server 38 a set of device-specific information or parameters, e.g., information suitable to identify the specific communication device for which the enablement of its JTAG interface is being requested. For example, the information supplied as part of the enablement request can include the chip serial number 32 of the communication device 10, the digital certificate or public key for the communication device 10, and an unencrypted version of the boot code image, e.g., the security processor boot code image, of the communication device 10.

The method 40 includes a step 44 of the access token server 38 building a new boot code image with "JTAG=ON" information. In response to the end user providing sufficient device-specific information, the access token server 38 initiates a process of building a new boot code image that includes suitable information to be used by the communication device 10 to enable the JTAG interface, i.e., suitable JTAG=ON information. The access token server 38 then generates a digital signature over the full boot code image.

The method 40 includes a step 46 of the access token server 38 encrypting the new boot code image. Once the access token server 38 builds the new boot code image with suitable JTAG=ON information for enabling the JTAG interface, the access token server 38 encrypts it. For example, the access token server 38 can use the GEK to encrypt the boot code image together with the digital signature. The access token server 38 then can use the unique public key of the communication device 10 to encrypt together the new boot code module (which already has been encrypted using the GEK) and the digital signature over the boot code.

The method 40 includes a step 48 of the access token server 38 creating and signing an access token or access token object. Once the boot code signature and the new boot code image have been encrypted together, the resulting encrypted component is included in an access token object created and signed by the access token server 38. The access token also can include the chip serial number, which was supplied to the access token server 38 by the end user. Also, the access token can include other parameters, such as the expiration or lifetime of the access token.

Alternatively, only a portion of the boot code image that controls the JTAG status (JTAG=ON) is encrypted together with the digital signature and included in the access token object. The digital signature still is computed over the full boot code image, but only a portion of the encrypted boot code image is included in the access token to save bandwidth. This alternative construction of an access token is acceptable because the remainder of the boot code image that does not affect the JTAG status already is stored in the device encrypted with the GEK. A device can later combine these two portions of the encrypted boot code image to produce the full boot code image encrypted with GEK, thus saving bandwidth.

The method 40 includes a step 52 of submitting the access token to the target device, i.e., the communication device 10. Once the access token server 38 has created and signed the access token, the access token server 38 transmits or otherwise provides the access token to the end user for transfer to the communication device 10. For example, the access token can be in the form of an electronic object attached to a file that the access token server 38 transmits to the target device communication device 10. Alternatively, the access token can be electronically transmitted to the end user's computer terminal, and subsequently transmitted to or downloaded by the communication device 10 via a dedicated connection between the end user's computer terminal and the communication device 10.

The method 40 includes a step 54 of validating and decrypting the access token received by the target communication device 10. Decryption of the access token includes using the private key of the communication device 10 to decrypt the (GEK-encrypted) new portion of the boot code (with JTAG=ON information) and the boot code signature, which, as discussed hereinabove, were previously encrypted and included as part of the access token. Validation of the access token includes verifying the digital signature included with the boot code in the access token. Validation of the access token also includes verifying that the chip serial number matches the chip serial number included with the access token. All or a portion of the validating and decrypting step 54 can be performed within the communication device 10 by the enable module 24 and/or other appropriate components within the communication device 10.

The method 40 also can include a step 56 of assembling the device boot code image with the new portion of the boot code with JTAG=ON information, which has been obtained with the access token and decrypted using the private key of the device. The new portion of the boot code replaces the portion of the boot code image that already was stored, i.e., the portion of the boot code image that had JTAG=OFF information. The newly assembled boot code is still encrypted using the global key GEK. It should be noted that although the new portion of the boot code was decrypted once (using the private key of the communication device 10), the new portion of the boot code that signals the JTAG interface to be enabled (JTAG=ON) is still encrypted with the GEK. The resulting image has further attached thereto the digital signature received via the access token. The digital signature also was present in the access token and was decrypted together with the portion of the boot code in the step 54. All or a portion of the assembling step 56 can be performed within the communication device 10 by the enable module 24 and/or other appropriate components within the communication device 10.

The method 40 also can include a step 58 of device binding the resulting boot code image. The device binding step 56 involves decrypting the boot code image with the GEK and then re-encrypting the decrypted boot code with the USK unique to the communication device 10. The resulting device bound boot code image then is stored in an appropriate location within the communication device 10, e.g., within the memory element 16. It should be noted that the previous GEK-encrypted boot code image, which includes appropriate JTAG=OFF information, also should be stored in an appropriate location within the communication device 10. The communication device 10 can revert back to the stored previous boot code, e.g., when the access token expires. All or a portion of the device binding step 58 can be performed within the communication device 10 by the enable module 24 and/or other appropriate components within the communication device 10.

The method 40 includes a step 62 of initializing or restarting the security processor 14. Once the new boot code image, which includes appropriate JTAG=ON information, has been assembled and, if desired, device bound, the security processor 14 is initialized with the new boot code, which results in the JTAG interface being enabled. As discussed herein, enabling the JTAG interface allows access to appropriate portions of the communication device 10, e.g., for debugging. All or a portion of the initialization step 62 can be performed within the communication device 10 by the enable module 24 and/or other appropriate components within the communication device 10.

As a result of the method 40, the communication device 10 includes an enabled JTAG interface, yet the JTAG=ON information has not been persistently stored anywhere on the communication device 10 that is either unencrypted or encrypted only with the GEK. Furthermore, the new portion of the boot code that enables the JTAG interface was transmitted to the communication device 10 as a double-encrypted image, including the unique public key of the communication device 10. Thus, if the transmission is intercepted, the new portion of the boot code that signals JTAG=ON can not be used on any other communication device. That is, the new portion of the boot code can only be used on the communication device 10 for which it was intended.

The method 40 includes a step 64 of the communication device 10 reverting back to the previous boot code, e.g., when the access token expires. As discussed hereinabove, the access token transmitted to the communication device 10 typically includes an expiration or lifetime. Also as discussed hereinabove, the previous GEK-encrypted boot code image, which includes appropriate JTAG=OFF information, is persistently stored in an appropriate location within the communication device 10. Within the communication device 10, upon expiration of the access token, the communication device 10 can revert back to the previous (JTAG=OFF) boot code, thus disabling access to the communication device 10 via the JTAG interface.

When the device 10 is fully rebooted (including the host processor 12), the re-assembled boot code of the security processor can be is erased from memory and the device 10 has to check again for the presence of an access token in persistent storage (e.g., flash memory or hard disk). If an access token is found in persistent memory, is still valid, and contains a portion of the boot code with JTAG=ON information, then the device repeats the sequence of steps in the method 40, starting with step 54, which results in the JTAG interface being enabled.

In an alternative embodiment, the access token server 38 has a database of symmetric device-unique keys, such as the USK, and in the encrypting step 46, encrypts the access token using the USK rather than using the public key of the device. In the access token validating and encrypting step 54, the portion of the boot code with JTAG=ON information is decrypted using the USK, where the decrypted code is still encrypted with the GEK.

In another alternative embodiment, the access token server 38 also has a database of symmetric device-unique keys, such as the USK. In the encrypting step 46, instead of double-encrypting the access token first using the GEK and then device public key, the access token server 38 encrypts the access token only with the USK. In the access token validating and encrypting step 54, it is not necessary to perform decryption, and the assembling step 56 can be skipped. In the device-binding step 58, only the portion of the boot code image that has been previously stored in the device encrypted with the GEK needs to be device bound (i.e., decrypted with the GEK and re-encrypted with the USK). Once device binding is done, the portion of the boot code in the access token already encrypted with the USK can be combined with the rest of the boot code image.

The are a few security considerations involved with the JTAG interface control method 40. The first security consideration involves the privacy of the GEK-encrypted portion of the boot code with JTAG=ON information. The second security consideration involves the requirement to boot the communication device from an encrypted boot module.

With respect to the first security consideration, the value of the new portion of the boot code (with the appropriate JTAG=ON information), which is encrypted only with the GEK, is kept secret. The unencrypted portion of the boot code may be known (e.g., the format is published in a chip vendor's specification). However, the GEK value is secret and preferably stored on a Hardware Security Module (HSM) within the access token server 38 or other appropriate location.

The GEK-encrypted portion of the boot code (with JTAG=ON information) is transmitted with an extra layer of encryption using a device public key, and therefore can not be discovered by inappropriate means via snooping on network interfaces. Within the communication device 10, it is assumed that such portion of the boot code is decrypted and quickly re-encrypted using the USK.

If the GEK-encrypted boot code (with JTAG=ON information) somehow were discovered by inappropriate means, the portion of the boot code with JTAG=ON information could be used to replace part of the current boot code stored in persistent memory within the communication device 10. However, the new code signature over the re-assembled boot code also would have to be discovered or obtained. This code signature is encrypted when the code signature is in an access token, but the code signature has to be stored in unencrypted form after the access token has been processed.

Therefore, the JTAG interface control method 40 depends greatly on the security of the access token server 38 and on security of the code running on the communication device 10 to make sure that the GEK-encrypted new portion of the boot code (with JTAG=ON information) is not divulged inappropriately. Although the new portion of the boot code is never stored persistently, the access token server 38 and the target communication device 10 still should be resistant to inappropriate attempts to access such information. For the communication device 10, a secure boot of the communication device 10 can prevent such inappropriate access. Also, it should be noted that the use of the JTAG interface to compromise the GEK-encrypted portion of the boot code is not a concern because at the time that the JTAG interface is enabled, the portion of the boot code (with JTAG=ON information) has been re-encrypted using the USK, and thus can not be used on another communication device.

With respect to the second security consideration, booting from a uniquely encrypted boot code module is required to prevent unauthorized parties from modifying the boot code to enable the JTAG interface. It is assumed that an unauthorized party does not know a device-unique key (e.g., the USK) and thus cannot make changes to an encrypted boot code module. In many conventional platforms that are based on a JTAG control block being included in the signed code that gets loaded into the target device during its boot process, the code initially is signed in its unencrypted state, i.e., before the code is encrypted. Therefore, the code signature is valid, regardless of whether or not the corresponding boot code is encrypted. If the boot code is encrypted, the boot code would be decrypted first and then the signature would be validated. Because the clear boot code image with JTAG=ON information is not bound to a specific device and might not contain a device-unique identifier, the signature on the clear boot code does not prevent the clear boot code from being used in other devices. Therefore, it becomes necessary to encrypt the boot code with a device-unique key, such as the USK.

If the communication device 10 allows the boot code module that determines the state of the JTAG interface to be loaded in the communication device 10 in either an encrypted or unencrypted form, then the unencrypted form of the boot code module that determines the state of the JTAG interface would become a "global secret" again. That is, the clear boot code module does not contain any device-specific information and is not bound to a specific device in any way, and thus can be illegally duplicated into other devices. If the unencrypted form of the boot code module that determines the state of the JTAG interface is leaked or somehow becomes available to inappropriate or unauthorized users, the unencrypted boot code module can replace an encrypted module in the flash memory of another communication device, and the signature would not need to change. Thus, such unencrypted boot code could be copied to another communication device and the device's JTAG interface could be enabled inappropriately.

To prevent such inappropriate enablement, the communication device should be configured to reject an unencrypted boot module, e.g., an unencrypted security processor boot module. Fortunately, many conventional communication device processor platforms allow such configuration. For example, with many conventional communication device processor platforms, the general CPU boot module is loaded and validated first. The CPU boot module then is capable of rejecting any unencrypted boot module, including unencrypted security processor boot modules. In this manner, only a uniquely encrypted boot module, e.g., a USK-encrypted security processor boot module, will not be rejected, and therefore allowed to determine the state of the JTAG interface.

According to other JTAG interface enablement control methods described herein, the access token server 38 signs a boot module with appropriate JTAG=ON information therein and also with a unique device identifier attached to the boot code image. In this manner, the boot code on the (general purpose) processor 24 will be execute first, and will check the unique device identifier attached to the code image. Only if the device identifier attached to the boot code image matches the particular communication device 10 will the processor 24 pass on the boot code image to the security processor 14 or other appropriate processor. The security processor 14 will enable the JTAG interface based on the JTAG=ON information in the boot code image. It should be noted that, in this particular JTAG interface enablement control method, the security processor boot code image is not encrypted at all.

Figure 4:
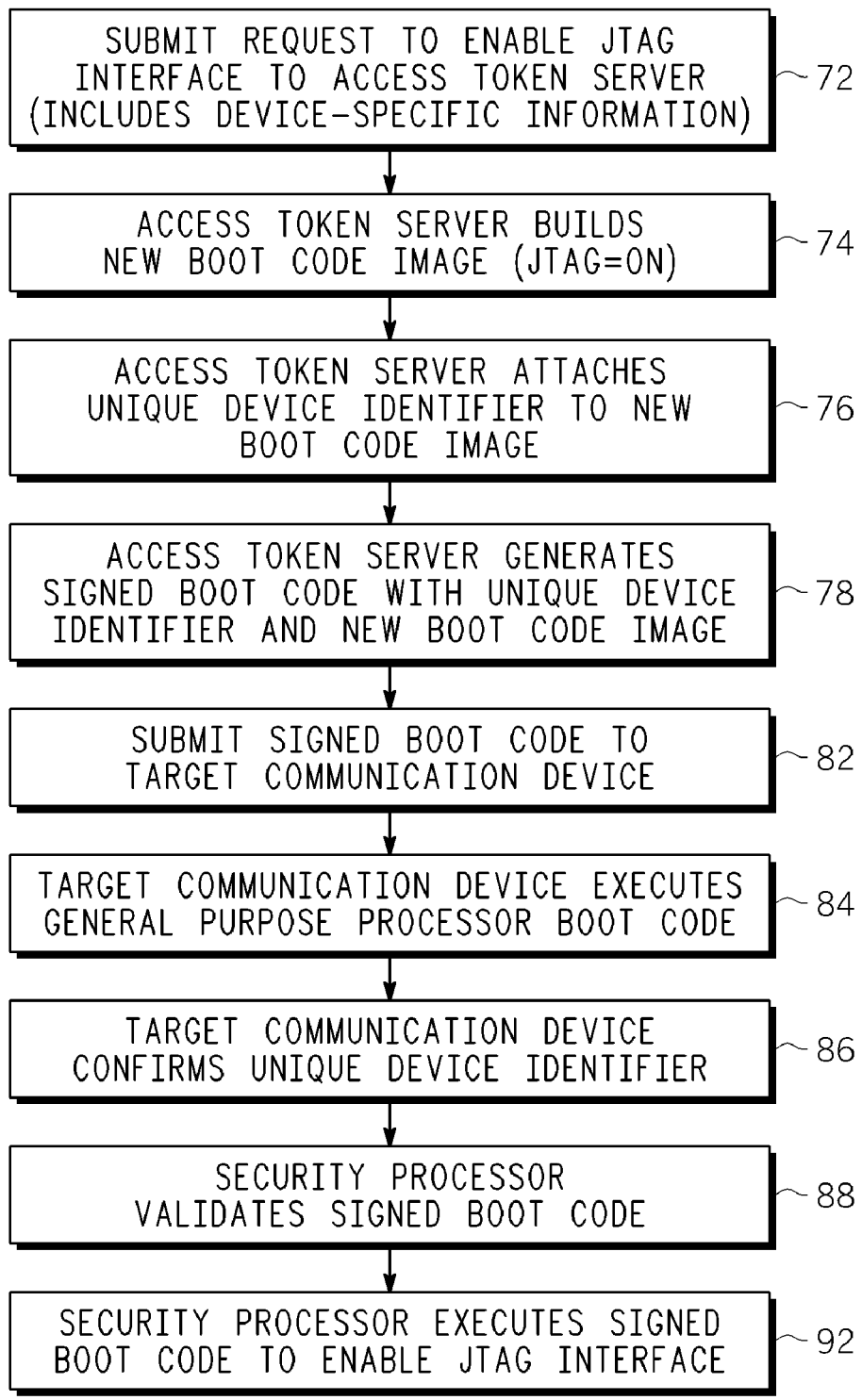
FIG. 4 is a flow chart that schematically illustrates another method for controlling JTAG interface enablement of the communication device in the system shown in FIG. 2.

Referring now to FIG. 4, with continuing reference to FIG. 2, shown is a flow chart that schematically illustrates another method 70 for controlling JTAG interface enablement of the communication device 10 within the system 30 shown in FIG. 2. The method 70 will be discussed with reference to the system 30 shown in FIG. 2. As discussed hereinbelow, in the method 70, a unique device identifier is used in a multiple processor architecture in which a general purpose processor boots first and then, if the unique device identifier is confirmed, i.e., matches the communication device, the security processor then boots and determines the state of the JTAG interface. It should be noted that, although unique device identifiers have been used before with communication devices, they have not been used with communication devices having multiple (two or more) processor architectures.

The method 70 includes a step 72 of submitting a request to enable or unlock the JTAG interface of a communication device having a specific (processor) chip, e.g., the communication device 10. When a need arises to enable the JTAG interface of the communication device 10, the end user 39 logs on to the access token server 38 and, upon recognition by the access token server as an authorized end user, submits a request to enable the JTAG interface of the communication device 10.

As part of the request to enable the JTAG interface of the communication device 10, the end user 39 includes a set of device-specific information or parameters, e.g., information suitable to identify the specific communication device for which the enablement of its JTAG interface is being requested. For example, the information supplied as part of the enablement request can include the chip serial number 32 of the communication device 10 and an unencrypted version of the boot code image (e.g., the security processor boot code image) without the signature. The unencrypted version of the boot code image may or may not include an associated portion of the boot code with JTAG=ON information. Unlike the JTAG interface enablement control method 40 described hereinabove, in the method 70, the request does not include a digital certificate unique to the communication device 10.

The method 70 includes a step 74 of the access token server 38 building a new boot code image with JTAG=ON. In response to the end user providing sufficient device-specific information, the access token server 38 initiates a process of building a new boot code image that includes suitable information to be used by the communication device 10 to enable the JTAG interface, i.e., suitable "JTAG=ON" information. Then the access token server 38 generates a digital signature over the full boot code image.

The method 70 includes a step 76 of the access token server 38 attaching a unique device identifier to the boot code. The method 70 then performs a step 78 of the access token server 38 generating a digital signature over the unique device identifier and the security processor boot code.

Figure 5:
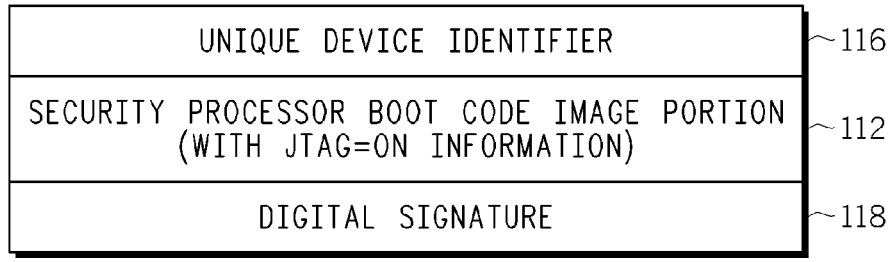
FIG. 5 is a block diagram of a boot code image generated by the access token server according to a portion of the method shown in FIG. 4.

Referring now to FIG. 5, with continuing reference to FIG. 4, shown is a block diagram of a boot code image 110 generated by the access token server 38 according to a portion of the method 70. As shown, the boot code image 110 includes a security processor boot code image 112 (with JTAG=ON information), a unique device identifier 116 attached to the security processor boot code image 112, and a digital signature 118 over the unique device identifier 116 and the security processor boot code 112.

Referring again to FIG. 4, the method 70 includes a step 82 of submitting the signed boot code image 110 to the target device, i.e., the communication device 10. Once the access token server 38 has created the signed boot code image 110, the access token server 38 transmits or otherwise provides the signed boot code image 110 to the end user for transfer to the communication device 10. The communication device 10 stores the received signed boot code image 110.

Alternatively, because the communication device 10 already has the boot code and the unique device identifier stored locally, only the new portion of the boot code (with JTAG=ON information) and the signature 118 are submitted to the end user and the target communication device 10. The communication device 10 can re-create the complete signed boot code image 110 with the locally-stored boot code and unique device identifier, and the new portion of the boot code (with JTAG=ON information) and the signature 118 received by the communication device 10.

The method 70 includes a step 84 of executing the general purpose processor boot code. Once the target communication device 10 receives (and stores) the signed boot code image 110, the general purpose processor within the target communication device 10 executes the code of the general purpose processor. It should be noted that, before shipment of the communication device 10, its security processor boot code, which was signed but not encrypted, was configured in a manner that disabled the JTAG interface (JTAG=OFF). At this point in the method 70, the JTAG interface still is disabled.

The method 70 includes a step 86 of confirming the unique device identifier in the signed security processor boot code image 110 received by the communication device 10. For example, the enable module 24 within the general purpose processor 12, or other appropriate component within the communication device 10, confirms that the unique device identifier in the signed security processor boot code image 110 received by the communication device 10 matches the unique device identifier stored locally in the target communication device 10. The device's unique device identifier preferably is stored with appropriate hardware protection such that it can not be modified. If the unique device identifier in the security processor boot code image matches the unique device identifier in the communication device 10, the general purpose processor 12 allows the constructed security processor boot code image with JTAG=ON information to be loaded into the security processor 14 for execution. If the unique device identifier in the security processor boot code image does not match the unique device identifier of the communication device 10, the boot sequence reverts back to the original stored boot code image with JTAG=OFF information, and the boot code sequence proceeds without enabling the JTAG interface.

As shown in FIG. 5, the unique device identifier 116 can be located just before the security processor boot code image 112. Alternatively, the unique device identifier 116 can be located just after the security processor boot code image 112, or even within the security processor boot code image, as long as the unique device identifier 116 is in a known location within the security processor boot code image 110.

The method 70 includes a step 88 of the security processor 14 validating the signed security processor boot code 110. If the unique device identifier in the security processor boot code image matches the unique device identifier of the communication device 10, the security processor boot code image (including the JTAG=ON information) is loaded into the security processor 14, and the security processor 14 validates the signed security processor boot code image 110, e.g., by verifying the code image signature 118. The confirmation step 86 and the validation step 88 can be executed in any suitable order.

The method 70 includes a step 92 of the security processor 14 executing the signed security processor boot code 110 to enable the JTAG interface. Once the security processor 14 validates the signed security processor boot code image 110, the security processor 14 executes a boot process using the signed security processor boot code 110. The security processor 14 will start execution at a specified Code Entry Point. If the unique device identifier 116 is located just before the security processor boot code image 112, the Code Entry Point will point to a location right after the unique device identifier. Alternatively, the boot code image contains instructions to jump over the memory location of the unique device identifier. The execution of the signed security processor boot code image 110, which includes the JTAG=ON information, enables the JTAG interface.

Compared to the JTAG interface control method 40 shown in FIG. 3 and described hereinabove, the JTAG interface control method 70 shown in FIG. 4 can be thought of as somewhat simpler because the signed boot code does not need to be encrypted or re-encrypted. However, despite the lack of encryption, the signed boot code is just as secure because the unique device identifier prevents the boot code image (with JTAG=ON information) from being used on any other communication device other than the intended target communication device, e.g., the target communication device 10.

Alternatively, in either JTAG interface method, the signed boot code image can be configured to include appropriate information to allow the signed boot code to be executed on a specified group of multiple communication devices rather than one particular communication device. For example, rather than including a single portion of the boot code with JTAG=ON information encrypted for one specific communication device, several copies of the JTAG=ON information and of the signature encrypted with the different device public keys or symmetric keys may be included in the access token for a corresponding group of communication devices. In this manner, the signed boot code image can be loaded onto multiple communication devices and used to enable the respective JTAG interface of the particular communication devices identified in the group of blocks within the signed boot code.

Also, alternatively, the boot code image may be signed together with a list of multiple device identifiers instead of just one device identifier. In this manner, any device that finds its own identifier in this list will accept the modified boot code with JTAG=ON information.

Although all of the JTAG interface control methods discussed hereinabove have many advantages, the JTAG interface control methods discussed hereinabove do bundle together JTAG enablement permission information with the boot code image. In some circumstances, it may be more convenient if JTAG enablement permission information is independent of the boot code image, and instead is bundled with an access token, i.e., along with any other debugging permissions.

According to yet other JTAG interface enablement control methods described herein, communication devices, prior to shipment, can be configured with two different boot code images: a first boot code image including appropriate JTAG=OFF information, and a second boot code image including appropriate JTAG=ON information. Also, two digital signatures are typically included for both versions of the boot code. Alternatively, to save storage space on the device, there is one common portion of the boot code image and two smaller portions of the boot code: one portion with JTAG=ON information and another portion with JTAG=OFF information.

Figure 6:
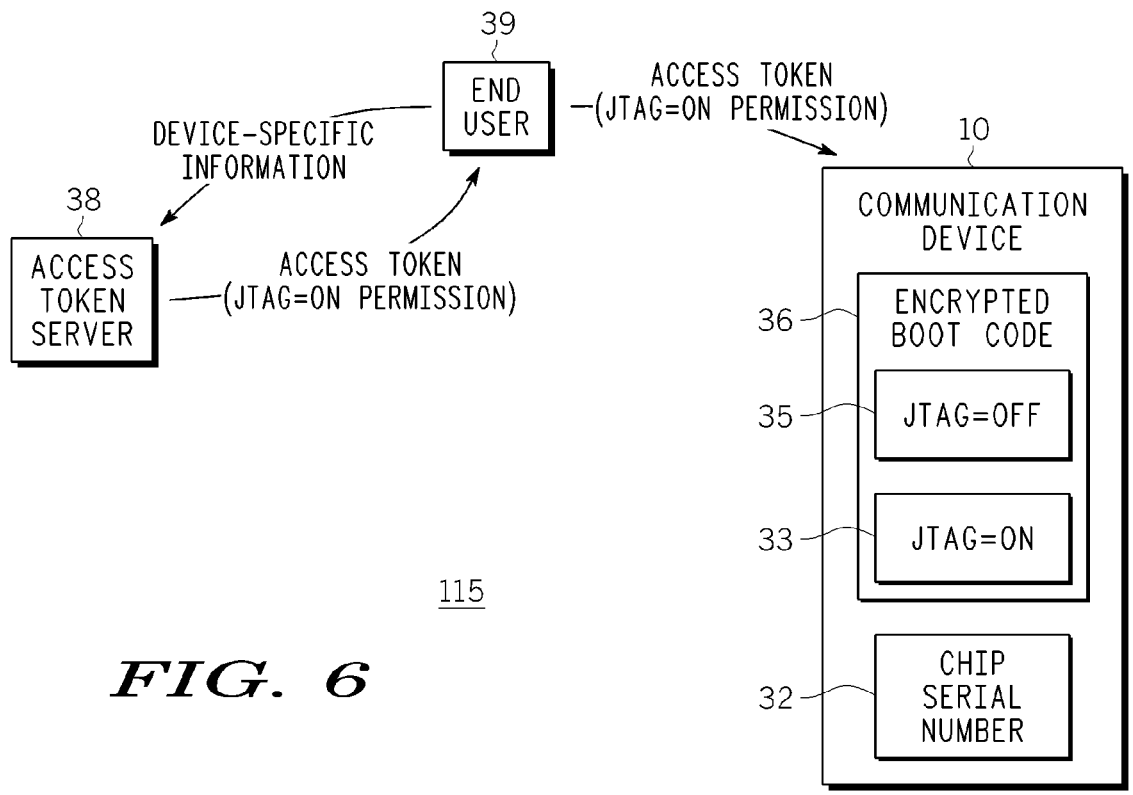
FIG. 6 is a block diagram of another system for controlling JTAG interface enablement of an end user communication device.

Referring now to FIG. 6, shown is a block diagram of a system 115 for controlling the enablement of a JTAG interface of an end user communication device. Portions of the system 115 are similar to the system 30 shown in FIG. 2. For example, the system 115 includes an end user communication device, such as the communication device 10, and an access token server 38, which, like the access token server 38 in the system 30, is configured to receive from an end user 39 a request to enable the JTAG interface in the communication device 10. However, the communication device 10 in the system 115 is configured differently than the communication device 10 in the system 30. In the system 115, the boot code 36 in the communication device 10 includes a first portion of the boot code 33 with JTAG=OFF information for disabling the JTAG interface of the communication device 10, and a second portion of the boot code 35, which includes appropriate JTAG=ON information for enabling the JTAG interface of the communication device 10. It should be noted that when the boot code image is loaded into a security processor, the boot code image will include either the first portion 33 with JTAG=ON information or the second portion 35 with JTAG=OFF (35) information, but not both portions.

Figure 7:
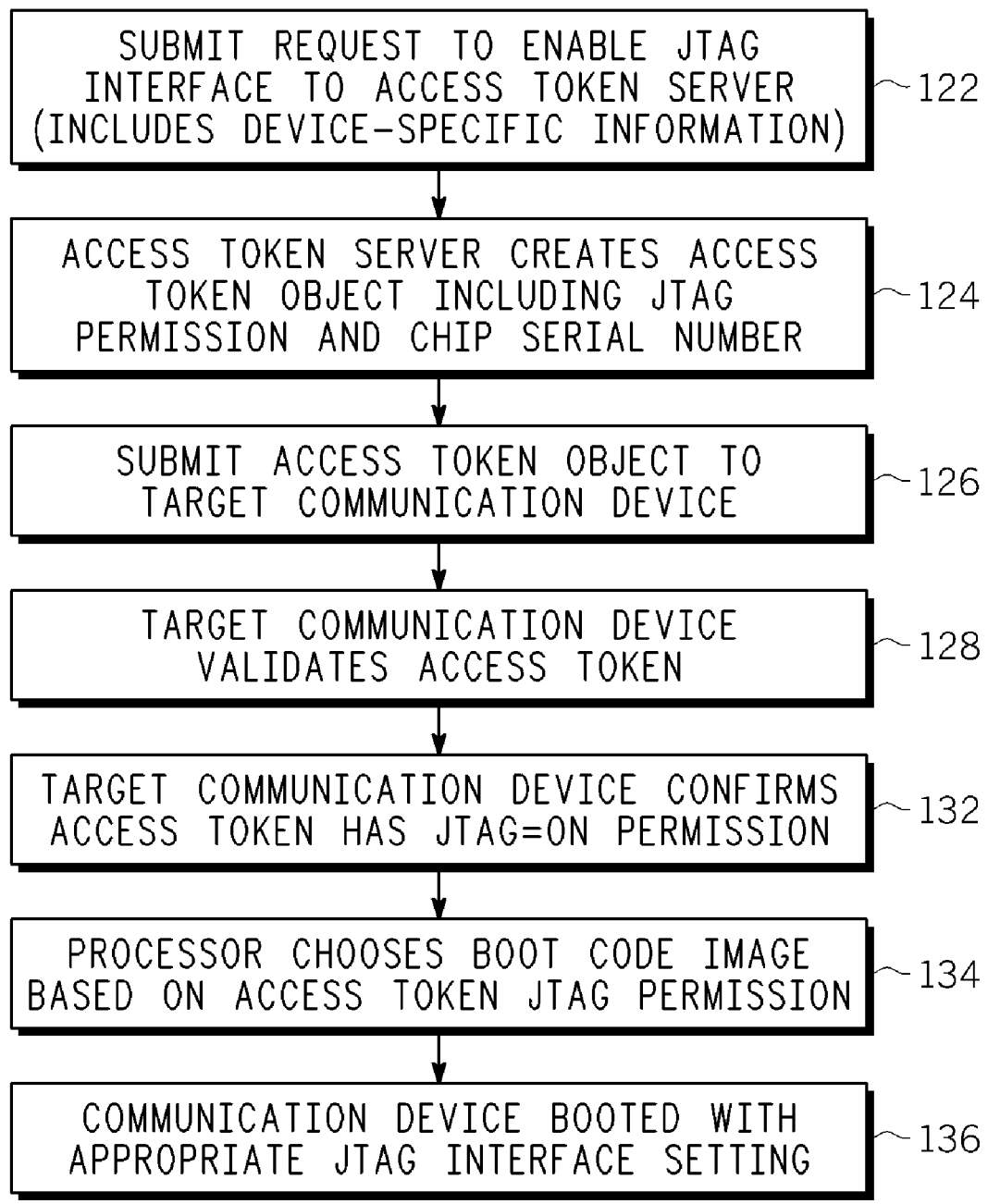
FIG. 7 is a flow chart that schematically illustrates yet another method for controlling JTAG interface enablement of the communication device in the system shown in FIG. 6.

Referring now to FIG. 7, with continuing reference to FIG. 6, shown is a flow chart that schematically illustrates a method 120 for controlling JTAG interface enablement of the communication device 10 shown in FIG. 6. The method 120 will be discussed with reference to the system 115 shown in FIG. 6.

The method 120 includes a step 122 of submitting a request to enable or unlock the JTAG interface of a communication device having a specific processor chip or chips, e.g., the communication device 10. When a need arises to enable the JTAG interface of the communication device 10, the end user 39 logs on to the access token server 38 and, upon recognition by the access token server as an authorized end user, submits a request to enable the JTAG interface of the communication device 10.

As part of the request to enable the JTAG interface of the communication device 10 according to the method 120, the end user 39 includes a set of device-specific information or parameters, e.g., information suitable to identify the specific communication device for which the enablement of its JTAG interface is being requested. For example, the information supplied as part of the enablement request typically includes the chip serial number 32 of the communication device 10.

The method 120 includes a step 124 of the access token server 38 creating and signing an access token or access token object. In response to the end user request to enable the JTAG interface of the communication device 10, the access token server 38 creates and signs an access token that includes appropriate JTAG permission information for the communication device 10 to use in enabling the JTAG interface. The access token server 38 also includes in the access token the chip serial number provided by the end user. Also, the access token can include other parametric information, such as the lifetime or expiration of the access token.

The method 120 includes a step 126 of submitting the access token to the target communication device 10. Once the access token server 38 has created and signed the access token, the access token server 38 transmits the access token to the end user for transfer to the communication device 10, e.g., in the manner discussed hereinabove with respect to other JTAG interface enablement control methods.

The method 120 includes a step 128 of validating the access token received by the target communication device 10. Validation of the access token includes verifying that the chip serial number within the communication device matches the chip serial number included with the access token. All or a portion of the validating step 128 can be performed within the communication device 10 by the enable module 24 and/or other appropriate components within the communication device 10.

The method 120 includes a step 132 of confirming that the access token includes appropriate JTAG=ON permission information. As discussed hereinabove, in response to a proper end user request for JTAG interface enablement, the access token server 38 includes appropriate JTAG=ON permission information in the access token. Upon receipt of the access token, the target communication device 10 confirms that the received access token includes such JTAG=ON permission information.

The method 120 includes a step 134 of choosing the appropriate boot code image based on the information provided by the access token. If the portion of the boot code with JTAG=ON information is stored separately, as part of the choosing step 134, the portion of the boot code with JTAG=ON information is combined with the rest of the boot code image and signature. When the security processor is set to boot up, if a valid access token with appropriate JTAG=ON permission has been received by the communication device 10, the general purpose processor will select or construct and pass the boot code with JTAG=ON information to the security processor. However, if the access token did not include appropriate JTAG=ON permission information, the general purpose processor will select and pass the boot code with JTAG=OFF information along with the corresponding digital signature to the security processor.

The method 120 includes a step 136 of the security processor booting up with the boot code passed to the security processor by the general purpose processor. Depending on which JTAG setting in the boot code was passed to the security processor, the security processor, upon boot up, will have the corresponding JTAG interface enablement setting. That is, if the JTAG=ON 33 version of the boot code was passed to the security processor, the security processor will boot up with the JTAG interface enabled. However, if the JTAG=OFF 35 version of the boot code was passed to the security processor, upon boot up of the security processor, the JTAG interface will remain disabled.

The method 120 includes many advantages. For example, to enable the JTAG interface, there is no requirement to make any updates to the security processor boot code. Also, no encryption is necessary. The only requirement is that the communication device obtain an access token that includes appropriate JTAG=ON permission information.

The method 120 can be further modified by including a list of device identifiers in the access token. In the validating step 128, the validation of a device identifier can include verifying that the identifier of a particular device is found within the list of identifiers that are in the access token. The use of a list of device identifiers in this manner provides the convenience of sharing one access token between multiple specified devices to enable the JTAG interface on all of such devices.

The methods shown in FIGS. 3, 4 and 7 may be implemented in a general, multi-purpose or single purpose processor. Such a processor will execute instructions, either at the assembly, compiled or machine-level, to perform that process. Those instructions can be written by one of ordinary skill in the art following the description of FIGS. 3, 4 and 7 and stored or transmitted on a computer readable medium. The instructions may also be created using source code or any other known computer-aided design tool. A computer readable medium may be any medium capable of carrying those instructions and includes random access memory (RAM), dynamic RAM (DRAM), flash memory, read-only memory (ROM), compact disk ROM (CD-ROM), digital video disks (DVDs), magnetic disks or tapes, optical disks or other disks, and silicon memory (e.g., removable, non-removable, volatile or non-volatile).

It will be apparent to those skilled in the art that many changes and substitutions can be made to the JTAG enablement control methods and devices herein described without departing from the spirit and scope of the invention as defined by the appended claims and their full scope of equivalents.

The invention claimed is:

1. A communication device, comprising:
at least one processor to receive an access token having a first boot code image portion encrypted with JTAG enablement information by an encryption key unique to the communication device;
a memory element coupled to the at least one processor for storing at least a portion of the first boot code image portion received by the at least one processor;
a JTAG interface coupled to the at least one processor and enabled to allow access to the at least one processor and disabled to prevent access to the at least one processor; and
an enablement module coupled to the at least one processor to enable and disable the JTAG interface based on the JTAG enablement information,
wherein at least one of the at least one processor and the enablement module authenticates the access token received by the communication device,
wherein at least one of the at least one processor and the enablement module combines the first boot code image portion with a second boot code image portion stored in the communication device to form an encrypted boot code image including the JTAG enablement information, and
wherein at least one of the at least one processor and the enablement module decrypts the encrypted boot code image to obtain the JTAG enablement information.

2. The device as recited in claim 1, wherein the second boot code image portion does not include any JTAG enablement information.

3. The device as recited in claim 1, wherein the first boot code image portion and the JTAG enablement information are encrypted by a global encryption key (GEK) prior to being encrypted by the encryption key unique to the communication device.

4. The device as recited in claim 3, wherein the encryption key unique to the communication device is one of a public key and a symmetric key.

5. The device as recited in claim 3, wherein at least one of the at least one processor and the enablement module decrypts at least a portion of the access token to obtain the JTAG enablement information first using a unique device decryption key and then using the global encryption key (GEK).

6. The device as recited in claim 1, wherein the access token is generated by an access token server in response to the access token server receiving device-specific information specific to the communication device.

7. The device as recited in claim 6, wherein the communication device has at least one chip serial number, and wherein the device-specific information includes the chip serial number.

8. The device as recited in claim 6, wherein the communication device provides an unencrypted version of the boot code image to the access token server in response to an access token request made to the communication device.

9. The device as recited in claim 8, wherein at least a portion of the access token is encrypted using the encryption key provided to the access token server as part of the device-specific information.

10. The device as recited in claim 1, wherein the access token includes multiple portions of boot code images, wherein at least one of the multiple portions of boot code images are encrypted with an encryption key unique to a particular communication device, and wherein the communication device decrypts the boot code image portion that was encrypted with the encryption key unique to the communication device.

11. The device as recited in claim 1, wherein the first boot code image portion is encrypted with JTAG enablement information by a Unit Specific Key (USK) unique to the communication device, and wherein at least one of the at least one processor and the enablement module decrypts the second boot code image portion, re-encrypts the second boot code image portion with the USK, and combines the first boot code image portion with the encrypted second boot code image portion to form an encrypted boot code image including the JTAG enablement information.

12. The device as recited in claim 1, wherein the JTAG enablement information includes at least one JTAG interface control block having a JTAG enablement flag to store a first value that enables the JTAG interface to allow access to the processor and a second value that disables the JTAG interface to prevent access to the processor.

13. A communication device, comprising:
 at least one general purpose processor to receive an access token having a first boot code image portion with JTAG enablement information, a unique device identifier attached to the first boot code portion, and a digital signature;
 a memory element coupled to the general purpose processor for storing at least a portion of the first boot code image portion received by the general purpose processor;
 a JTAG interface coupled to the general purpose processor and enabled to allow access to the general purpose processor and disabled to prevent access to the general purpose processor;
 a security processor coupled to the general purpose processor and coupled to the JTAG interface; and
 an enablement module coupled to the general purpose processor to enable and disable the JTAG interface based on the JTAG enablement information,
 wherein at least one of the general purpose processor, the security processor and the enablement module authenticates the access token received by the communication device,
 wherein the general purpose processor passes the first boot code image portion to the security processor only if the unique device identifier attached to the first boot code image portion matches a corresponding unique device identifier stored within the communication device,
 wherein the security processor is configured to combine the first boot code image portion with a second boot code image portion stored in the communication device to form an encrypted boot code image including the JTAG enablement information, and
 wherein at least one of the general purpose processor, the security processor and the enablement module is configured to decrypt the encrypted boot code image to obtain the JTAG enablement information.

14. The device as recited in claim 13, wherein the access token includes a plurality of unique device identifiers, and wherein the general purpose processor passes the first boot code image portion to the security processor only if one of the plurality of unique device identifiers matches a corresponding unique device identifier stored within the communication device.

15. A communication device, comprising:
 at least one general purpose processor to receive an access token having a unique device identifier and a digital signature, wherein the general purpose processor includes a boot code image portion having JTAG enablement (JTAG=ON) information and a boot code image portion having JTAG disablement (JTAG=OFF) information;
 a memory element coupled to the general purpose processor for storing at least a portion of the first boot code image portion received by the general purpose processor;
 a JTAG interface coupled to the general purpose processor and enabled to allow access to the general purpose processor and disabled to prevent access to the general purpose processor;
 a security processor coupled to the general purpose processor and coupled to the JTAG interface; and
 an enablement module coupled to the general purpose processor to enable the JTAG interface based on JTAG enablement (JTAG=ON) information and disable the JTAG interface based on JTAG disablement (JTAG=OFF) information,
 wherein at least one of the general purpose processor, the security processor and the enablement module authenticates the access token received by the communication device,
 wherein the general purpose processor passes the boot code image portion having JTAG enablement (JTAG=ON) information to the security processor if the unique device identifier received by the communication device matches a corresponding unique device identifier stored within the communication device,
 wherein the general purpose processor passes the boot code image portion having JTAG disablement (JTAG=OFF) information if the unique device identifier received by the communication device does not match a corresponding unique device identifier stored within the communication device,
 wherein the security processor combines either the boot code image portion having JTAG enablement (JTAG=ON) information or the boot code image portion having JTAG disablement (JTAG=OFF) information with an existing boot code image portion stored in the communication device to form a combined boot code image including either JTAG enablement (JTAG=ON) information or JTAG disablement (JTAG=OFF) information, and
 wherein at least one of the security processor and the enablement executes the combined boot code image to either enable or disable the JTAG interface.

16. The device as recited in claim 15, wherein the access token includes a plurality of unique device identifiers, and wherein the general purpose processor passes the first boot code image portion to the security processor only if one of the plurality of unique device identifiers matches a corresponding unique device identifier stored within the communication device.

17. A method for controlling the enablement of a JTAG interface of a communication device, the method comprising:
 receiving an access token having a first boot code image portion encrypted with JTAG enablement information by an encryption key unique to the communication device, wherein the communication device enables and disables the JTAG interface based on the JTAG enablement information;

authenticating the access token received by the communication device based on the device-specific information;

combining the first boot code image portion with a second boot code image portion stored in the communication device to form an encrypted boot code image including the JTAG enablement information; and decrypting the encrypted boot code image to obtain the JTAG enablement information.

18. A non-transitory computer readable medium storing instructions that, when executed on a programmed processor, carry out a method for controlling the enablement of a JTAG interface of a communication device, the computer readable medium comprising:

instructions for receiving an access token having a first boot code image portion encrypted with JTAG enablement information by an encryption key unique to the communication device, wherein the communication device enables and disables the JTAG interface based on the JTAG enablement information;

instructions for authenticating the access token received by the communication device based on the device-specific information;

instructions for combining the first boot code image portion with a second boot code image portion stored in the communication device to form an encrypted boot code image including the JTAG enablement information; and instructions for decrypting the encrypted boot code image to obtain the JTAG enablement information.

* * * * *